United States Patent
Alexander

(10) Patent No.: US 6,306,739 B1
(45) Date of Patent: Oct. 23, 2001

(54) METHOD AND APPARATUS FOR DEPOSITING THIN FILMS OF GROUP III NITRIDES AND OTHER FILMS AND DEVICES MADE THEREFROM

(75) Inventor: Michael N. Alexander, Lexington, MA (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 09/299,931

(22) Filed: Apr. 27, 1999

(51) Int. Cl.[7] ................................................... H01L 21/20
(52) U.S. Cl. ..................... 438/584; 438/492; 438/493; 438/496; 438/497; 438/500; 438/503; 438/507; 438/478; 257/412; 257/486
(58) Field of Search ................................... 438/584, 438, 438/492–503; 257/412, 486

(56) References Cited

U.S. PATENT DOCUMENTS

| | | | | |
|---|---|---|---|---|
| 4,144,116 | * | 3/1979 | Jacob et al. | 156/611 |
| 5,814,239 | * | 9/1998 | Kaneko et al. | 216/63 |
| 5,846,508 | * | 12/1998 | Chung et al. | 423/412 |
| 6,096,282 | * | 8/2000 | Kaner et al. | 423/409 |
| 6,110,809 | * | 6/1998 | Sze et al. | 438/503 |
| 6,113,985 | * | 4/1999 | Suscavage et al. | 427/255.39 |

OTHER PUBLICATIONS

Sylwester Porowski, Bulk and Homoepitaxial GaN–growth and Characterisation, Journal of Crystal Growth, 1998, 153–158, 189/190, Elsevier Science B.V., Warsaw, Poland.

Y. Naoi*.K.Kobatake, S. Kurai, K. Nishino, H. Sato, M. Nozaki, S. Sakai, Y. Shintani, Characterization of bulk GaN grown by sublimation technique, Journal of Crystal Growth, 1998, 163–166, 189/190, Elsevier Science B.V., Warshaw, Poland.

R.J. Molanar, P.Maki, R. Aggarwal, Z.L. Liau, E.R. Brown, I. Melngailis W. Gotz, L.T. Romano, N.M. Johnson, Gallium Nitride Thick FIlms Grown by Hydride Vapor Phase Epitaxy, Symposium E "III–Nitride, SiC and Diamond for Electronic Devices", 1996, vol. 423, Mater. Soc. Symp. Proc., USA.

Glen A. Slack, T.F. McNelly, Growth of HIgh Purity AlN Crystals, Journal of Crystal Growth, 1976, 263–279, 34, North–Holland Publishing Company.

T. Detchprohm, K.Hiramatsu, N. Sawaki, I. Akasaki, The homoepitaxy of GaN by metalorganic vapor phase epitxy using GaN substrates, Journal of Crystal Growth, 1994, 170–174, 137, Elsevier.

Takao Ishii, Yasuo Tazoh, Shinataro Miyazawa, LiGaO2 single crystal as a lattice–matched substrate for hexagonal GaN thin films, Journal of Crystal Growth, 1998, 208–212, 189/190, Elsevier Science B.V.

H.P. Maruska,J.J. Tietjen, The Preparation and Properties of Vapor–Deposited Single Crystal–Line GaN, Applied Physics Letters, Nov. 15, 1969, 327–329, vol. 15 No. 10.

* cited by examiner

Primary Examiner—Matthew Smith
Assistant Examiner—Granvill D. Lee, Jr.
(74) Attorney, Agent, or Firm—Stanton E. Collier

(57) ABSTRACT

In this invention, one or more metal-containing sources and one or more ammonium halides are heated such that they evaporate into a vacuum environment (except that, in MOMBE, a beam of the organometallic source compound may be created by other means) and made to impinge on a substrate. The materials interact on the substrate to form a film of the desired nitride compound or alloy; the substrate usually will be heated to promote chemical reaction and good film properties such as high crystallinity. Other sources—to provide dopant impurities like silicon or magnesium, for example—would be part of a deposition system envisioned in this invention. Multiple film layers, including quantum wells and superlattices, may be formed using this method, in addition to a single film.

12 Claims, 3 Drawing Sheets

METHOD AND APPARATUS FOR DEPOSITING THIN FILMS OF GROUP III NITRIDES AND OTHER FILMS AND DEVICES MADE THEREFROM

STATEMENT REGARDING FEDERALLY SPONSORED RESEARCH OR DEVELOPMENT

The invention described herein may be manufactured and used by or for the Government for governmental purposes without the payment of any royalty thereon.

CROSS-REFERENCES TO RELATED PATENT APPLICATIONS

This patent application is related to Air Force inventions AFB00437 and AFB00473 which are being concurrently filed herewith.

BACKGROUND OF THE INVENTION

One of the major difficulties encountered in forming high quality nitride films is creating conditions in which sufficient nitrogen is incorporated in the film.

The material quality of the nitride can be significantly degraded if the fractional deficiency of nitrogen is as small as one part per hundred thousand. The difficulty arises because molecular gaseous nitrogen, $N_2$, is chemically stable: in nitride deposition processes the formation of $N_2$ is chemically favored over the formation of nitrides. In molecular beam epitaxy (MBE), for example, various schemes have been employed to deliver nitrogen to the substrate in chemically active forms—for example, by exciting gaseous nitrogen via plasma or electron cyclotron resonance sources, or by using ammonia ($NH_3$) gas—to increase the likelihood that delivered nitrogen will react with the metal (e.g., with Ga to form GaN), somewhat overcoming the strong propensity of the delivered nitrogen to form $N_2$.

There is a large technical literature pertaining to evaporative deposition of films. Long-established methods are summarized in the book by Joseph I. Goldstein et al., *Scanning Electron Microscopy and X-Ray Microanalysis* (New York and London: Plenum Press, 1992), Section 13.6, and in Chapter 9 of the book edited by S. M. Sze, *VLSI Technology* (McGraw-Hill, 1983). MBE has recently been reviewed in an article by K.-Y. Cheng, "Molecular Beam Epitaxy of III–V Compound Semiconductors for Optoelectronic Applications," Proceedings of the IEEE, Volume 85, No. 11 (November 1997), pp. 1694–1714. Use of MBE methods specifically for deposition of nitride films has recently been reviewed in the article by G. Popovici, H. Morkoç, and S. N. Mohammed, "Deposition and properties of group III nitrides by molecular beam epitaxy," pp. 19–69 in the book *Group III Nitride Semiconductor Compounds*, edited by Bernard Gil (Oxford University Press, 1998).

BRIEF SUMMARY OF THE INVENTION

This invention relates to the use of ammonium halides (e.g., ammonium chloride, ammonium bromide, or ammonium iodide) to form films of metal nitrides (M-nitrides), specifically in the formation of films and multiple film layers by evaporative deposition methods. It relates to traditional evaporation methods as well as to the family of precisely controllable deposition methods known as molecular beam epitaxy (MBE); the latter includes methods known as solid source MBE (SSMBE), gas source MBE (GSMBE), chemical beam epitaxy (CBE), and metal-organic MBE (MOMBE).

The object of this invention is to deliver nitrogen to the substrate in a new way, which, by increasing the likelihood of nitride formation, promotes growth of superior nitride films in evaporative deposition methods. Such films—in particular, specially designed multiple film layers—may be used to create electronic devices such as metal-semiconductor field effect transistors (MESFETs), metal-insulator field effect transistors (MISFETs), high electron mobility transistors (HEMTs), modulation doped field effect transistors (MODFETs), and heterojunction bipolar transistors (HBTs). They are also employed to form semiconductor light-emitting diodes (LEDs), lasers, and optical detectors, and also optical coatings (e.g., antireflection coatings, reflective coatings, and filters).

This deposition of nitride films under vacuum conditions may include several techniques such as: (1) conventional evaporation methods such as electron beam evaporation and its counterparts in which heat for evaporation is supplied by resistance or RF heating; and (2) MBE and related ultrahigh vacuum methods for depositing films, including methods known as SSMBE, GSMBE, CBE, and MOMBE. In this invention, one or more metal-containing sources and one or more ammonium halides are heated such that they evaporate into a vacuum environment (except that, in MOMBE, beams of metal-containing organometallic source compounds may be created by other means) and made to impinge on a substrate. The materials interact on the substrate to form a film of the desired nitride compound or alloy; the substrate usually will be heated to promote chemical reaction and good film properties such as high crystallinity. Other sources—to provide dopant impurities like silicon or magnesium, for example—would be part of a deposition system envisioned in this invention. Multiple film layers, including quantum wells and superlattices, may be formed using this method, in addition to a single film.

Therefore, one object of the present invention is to provide a process of making metal nitrides by evaporative deposition.

Another object of the present invention is to provide a process of making metal nitride films by evaporative deposition from which new electronic devices may be fabricated.

These and many other objects and advantages of the present invention will be readily apparent to one skilled in the pertinent art from the following detailed description of preferred embodiments of the invention and the related drawings.

DETAILED DESCRIPTION OF THE INVENTION

The purpose of this invention is to deposit Group III (of the Periodic Table) nitride films such as films of gallium nitride (GaN), aluminum nitride (AlN), indium nitride (InN), their alloys, and related compounds/alloys such as $Ga_xIn_yAl_{1-x-y}N$ where x+y is less than or equal to 1 and x and y are both greater than or equal to zero, and $ZnGeN_2$, for electronic and optoelectronic devices, and for applications such as optical coatings and (taking advantage of the hardness of GaN and AlN, for example) transparent coatings having wear and scratch resistance.

Properly designed combinations of films may be processed to fabricate transistors and rectifier devices, or semiconductor light-emitting diodes (LEDs), lasers, and optical detectors. Nitride-based transistors are expected to be useful for extremely high-power microwave transmitter components and for components operating at high temperatures. Nitride-based LEDs and lasers can produce ultraviolet, blue, or green light with efficiencies greatly exceeding the efficiencies of other semiconductor emitter devices.

Figures 1A, 1B:
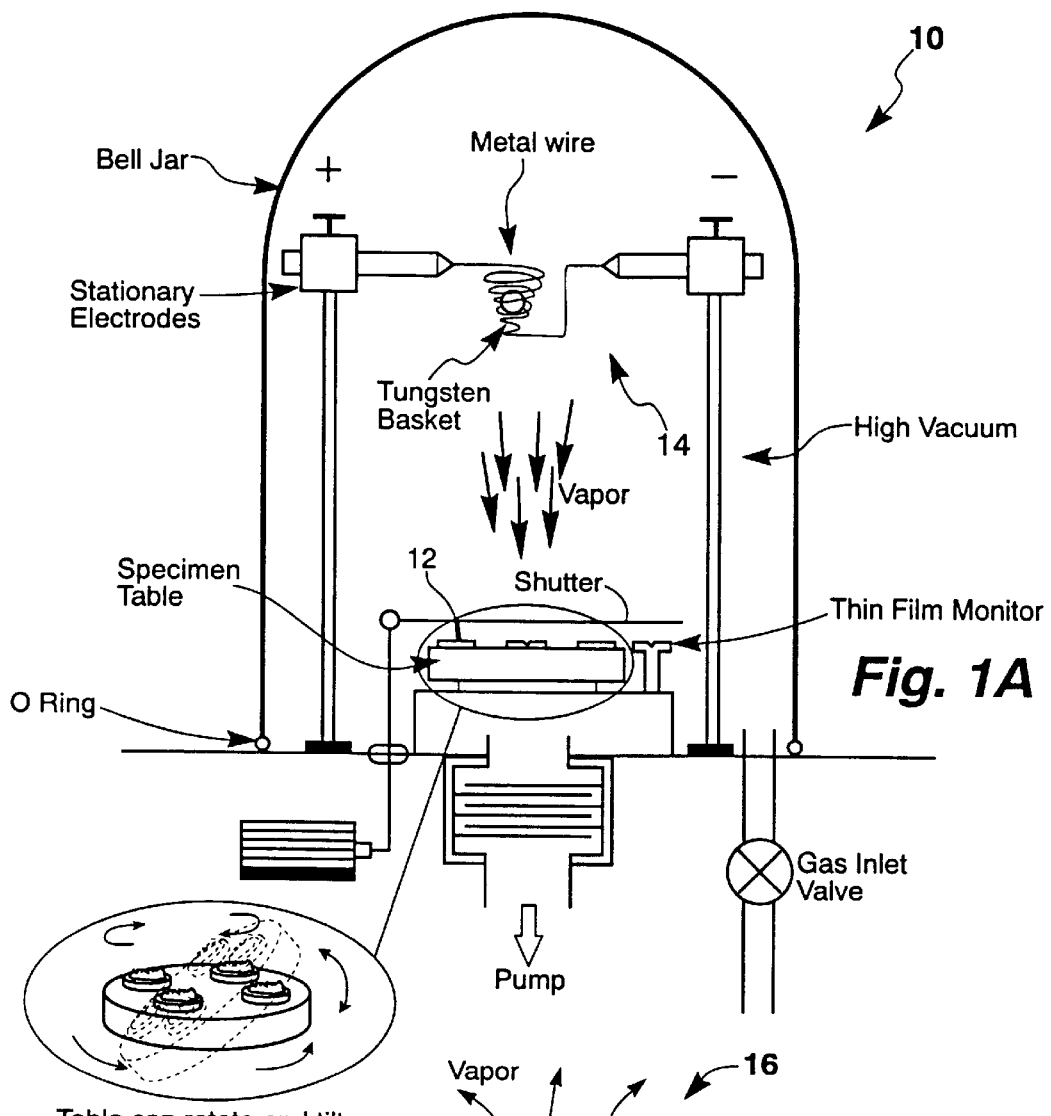
FIG. 1A illustrates by partial schematic a high-vacuum thermal evaporation apparatus.
FIG. 1B illustrates a device that may be used as an inductively heated evaporation source of metal.
Figure 2A:
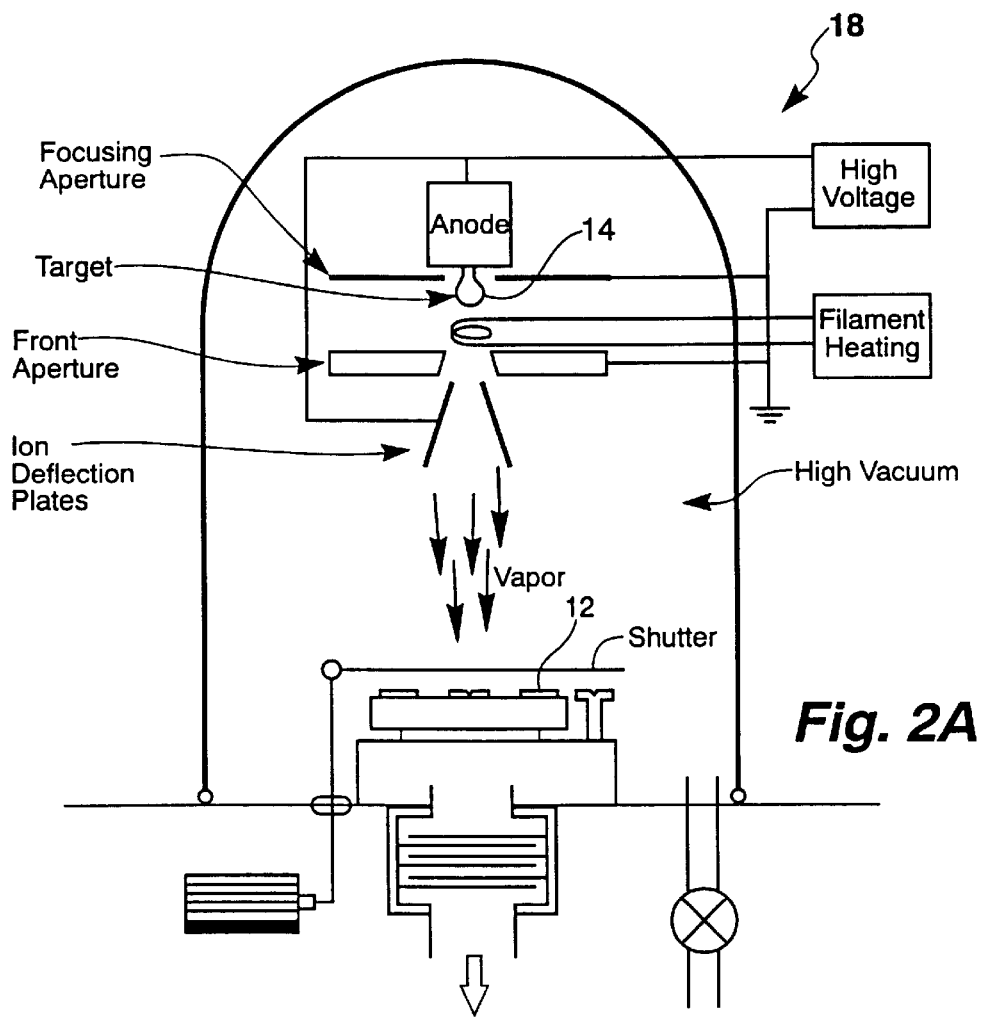
FIG. 2A illustrates by partial schematic an electron-beam evaporation deposition apparatus.
Figure 2B:
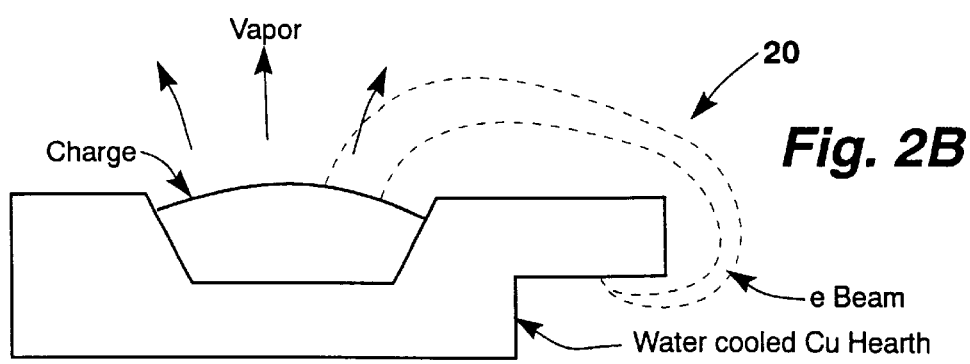
FIG. 2B illustrates by partial schematic an e-beam evaporation device.
Figure 3:
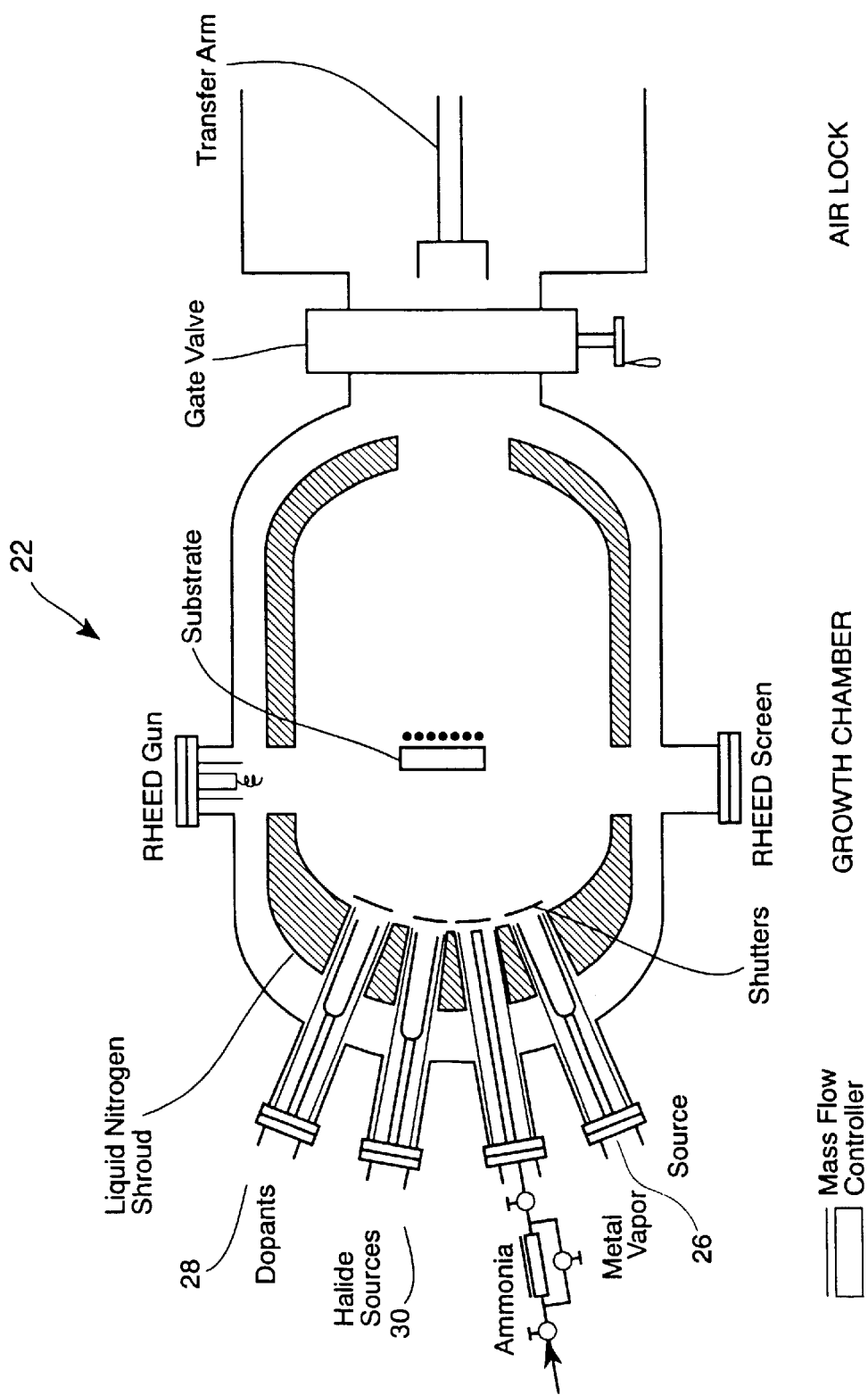
FIG. 3 illustrates by partial schematic a MBE apparatus for nitride deposition.

FIG. 1A is a schematic drawing of a traditional thermal evaporation deposition apparatus 10 in which the substrate 12 lies below at least one source 14; FIG. 1B shows a detail of an alternative evaporation source 16, which would be used for evaporation in which the substrate is above the source. FIG. 2A is a schematic drawing of a traditional electron-beam evaporation deposition apparatus 18, in which the substrate 12 lies below at least one source 14. FIG. 2B shows a detail of a different kind of electron beam evaporation source 20; the substrate, not shown, would be mounted physically above this source, not shown. (FIGS. 1A and 2A are adapted from the book by Goldstein et al.; FIGS. 2A and 2B are adapted from the book by Sze.) Although FIGS. 1 and 2 show single sources of material, in practice several sources can be used within a vacuum chamber. FIG. 3 is a schematic drawing of an MBE apparatus 22 for nitride deposition, adapted from the article by Popovici et al.

The current substrates of choice for M-nitride electronic components are sapphire, lithium gallium oxide, silicon carbide or zinc oxide (If large substrates of nitrides, e.g., GaN or AlN, were available, they would be the preferred substrates). Other types of substrates for deposition of M-nitride materials may be mirrors, lens, prisms, etc. for coating purposes. M represents gallium, aluminum, indium, germanium, zinc and ternary combinations and alloys of the above such as zinc germanium and indium aluminum gallium.

The traditional evaporation and MBE apparatuses have in common the feature that deposition takes place in a vacuum environment (ultra-high vacuum, for MBE). In traditional evaporation systems and SSMBE, one or more precursor materials are heated to evaporate them, and their vapors travel to, and deposit on, the substrate. In other forms of MBE the sources may be small gas flows directed toward the substrate; or there may be a mixture of different source types. In GaN deposition, a beam of metallic Ga is usually obtained from an effusion cell such as a Knudsen cell, and the nitrogen is obtained from gaseous ammonia or activated nitrogen gas (current activation sources include plasma cells and electron cyclotron resonance sources). The substrate is usually heated to promote chemical reaction between deposited constituents, to achieve desired film morphology, etc.

In the apparatuses disclosed here, nitrogen is obtained from a source consisting of an ammonium halide—for example, ammonium fluoride, ammonium chloride, ammonium bromide, or ammonium iodide. A source containing halide mixtures, or multiple independently controlled sources (e.g., a chloride source plus an iodide source) might be employed. Such sources would replace the nitrogen sources mentioned above as the primary source of nitrogen for film growth. In the MBE implementation, each beam of ammonium halide would be preferably obtained from an appropriate effusion cell analogous to the metal effusion cells in the established MBE as shown in FIG. 3. For each type of metal a separate port 26 would be required as well as a separate ports 28 and 30 for the different dopants and halide sources, respectively. Other constituent parts of the evaporation or MBE apparatus would be substantially the same as in current practice.

The invention uses a metal source(s) and dopant source(s) which are set up and used according to conventional practice. The ammonium halide source(s) is/are heated to evaporate the ammonium halide and create a halide vapor; in the preferred MBE embodiment, a heated effusion cell is used to create a halide beam, similar to the practice of solid source MBE. Components of the different beams—e.g., the halide beam and one or more metal beams-impinge on the substrate. The substrate is heated to the temperature which best promotes the best growth of nitride films ("best" may be determined, for example, by resulting characteristics of specific devices). The relative intensities of the beams are, likewise, optimized to produce the desired compound or alloy stoichiometries, dopant concentrations, film morphology, electronic properties, etc. Multiple film layers are deposited in a manner analogous to deposition using current MBE or traditional evaporation methods.

As mentioned in the Background, nitrogen incorporation in nitride films is difficult if current state-of-the-art methods are employed. Recent experiments, at atmospheric pressure, have demonstrated that ammonium halides react readily with metals like Ga to form nitrides like GaN. The same will occur in the vacuum deposition environments of traditional evaporation apparatuses or of MBE apparatuses, resulting in significantly improved deposition of nitrides in such apparatuses, and possibly also higher deposition rates.

Since the key inventive concept is use of an ammonium halide as the primary source of nitrogen for nitride films, the invention applies to all modalities of MBE—SSMBE, GSMBE, CBE, MOMBE, and possible hybrids. The invention also includes use of supplementary nitrogen sources, e.g., using ammonia in MBE, to help shift the chemical equilibrium in desired ways. It also includes deposition of films that are alloys of metal nitrides and other substances—e.g., gallium-indium-nitride-arsenides and wide bandgap nitride compounds such as $ZnGeN_2$.

Clearly many modifications and variations of the present invention are possible in light of the above teachings and it is therefore understood, that within the inventive scope of the inventive concept, that the invention may be practiced otherwise than specifically claimed.

What is claimed is:

1. A process to form a metal-nitride material using a high vacuum, thermal evaporation apparatus, said process comprising the steps of:

placing a substrate in the evaporation apparatus;

placing at least one ammonium halide compound in a first device to form an ammonium halide vapor source;

placing at least one metal-containing substance in a second device to form a metal vapor source; and allowing the halide vapor and the metal vapor from said metal vapor source to form a M-nitride material on the substrate.

2. A process as defined in claim 1 further including depositing at least one film layer on said M-nitride material.

3. A process as defined in claim 1 wherein the ammonium halide compound is selected from the group consisting of ammonium fluoride, ammonium chloride, ammonium bromide and ammonium iodide.

4. A process as defined in claim 1 wherein the ammonium halide vapor source is a heated effusion cell.

5. A process as defined in claim 1 further including at least one dopant source.

6. A process as defined in claim 4 further including at least two metal vapor sources.

7. A process as defined in claim 1 wherein the metal in the metal source is selected from the group consisting of gallium, aluminum, indium, germanium, zinc, and binary and ternary combinations of these including alloys.

8. A process as defined in claim 1 wherein the metal is selected from the group consisting of gallium, aluminum and indium.

9. A process as defined in claim 1 wherein the process of molecular beam epitaxy (MBE) and related ultrahigh vacuum methods for depositing films are used including methods known as solid source MBE (SSMBE), gas source MBE (GSMBE), chemical beam epitaxy (CBE), and metal-organic MBE (MOMBE).

10. A process as defined in claim 1, said substrate selected from the group consisting of sapphire, lithium gallium oxide, silicon carbide, zinc oxide, gallium nitride and aluminum nitride.

11. A process as defined in claim 1 wherein said substrate is selected from the group consisting of mirrors, prisms, lens, and other optical components.

12. A process as defined in claim 1 further including heating the substrate to a desired temperature to enhance the formation of a thin film of metal-nitride (M-nitride).

* * * * *